United States Patent [19]

Igura

[11] Patent Number: 5,687,107

[45] Date of Patent: Nov. 11, 1997

[54] EXCLUSIVE-OR GATE, AN INVERTED TYPE SELECTOR, AND ADDERS

[75] Inventor: Hiroyuki Igura, Tokyo, Japan

[73] Assignee: NEC Corporation, Tokyo, Japan

[21] Appl. No.: 524,808

[22] Filed: Sep. 7, 1995

[30] Foreign Application Priority Data

Sep. 8, 1994 [JP] Japan .................... 6-214832

[51] Int. Cl.$^6$ .............. G06F 7/50; H03K 19/21
[52] U.S. Cl. ............. 364/768; 364/784; 326/52; 326/55
[58] Field of Search .............. 364/768, 784–788; 326/52–55, 112–115, 119–125; 327/199, 202, 215, 404, 408

[56] References Cited

U.S. PATENT DOCUMENTS

| | | | |
|---|---|---|---|
| 4,468,574 | 8/1984 | Engeler et al. | 326/55 |
| 4,484,091 | 11/1984 | Nagano | 326/52 |
| 4,601,007 | 7/1986 | Uya et al. | 364/784 |
| 4,709,346 | 11/1987 | Henlin | 326/55 |
| 4,739,195 | 4/1988 | Masaki | 326/55 |
| 4,749,886 | 6/1988 | Hedayati | 326/55 |
| 4,970,677 | 11/1990 | Young | 364/784 |
| 5,233,233 | 8/1993 | Inoue et al. | 327/408 |

OTHER PUBLICATIONS

Kanie et al., "4–2 Compressor With Complementary Pass–Transistor Logic", *IEICE Trans. Electron.*, vol. E77(4):647–649, (1994).

*Primary Examiner*—Reba I. Elmore
*Assistant Examiner*—Emmanuel L. Moise
*Attorney, Agent, or Firm*—Foley & Lardner

[57] ABSTRACT

A new type exclusive-OR gate and an inverted type selector are composed using a cascaded connection of two p-type MOSFETs between a positive terminal of a power supply and an signal output terminal, and a cascaded connection of two n-type MOSFETs between a grounded terminal of the power supply and the signal output terminal. Power consumption in the new type exclusive-OR gate and the inverted type selector is reduced by reducing number of conventional inverters used in these circuits. A full-adder and a 4-2 compressor are designed using these new type exclusive-OR gates and inverted selectors or an inverted type selector.

4 Claims, 8 Drawing Sheets

| INPUT | | | OUTPUT | |
|---|---|---|---|---|
| X1 | X2 | X3 | Cy | Sum |
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

FIG. 12

| INPUT | | | | | OUTPUT | | |
|---|---|---|---|---|---|---|---|
| Cin | X4 | X3 | X2 | X1 | Cout | Cy | Sum |
| 0 | 0 | 0 | 0 | 0 | 0 | 0 | 0 |
| 0 | 0 | 0 | 0 | 1 | 0 | 0 | 1 |
| 0 | 0 | 0 | 1 | 0 | 0 | 1 | 1 |
| 0 | 0 | 0 | 1 | 1 | 1 | 0 | 0 |
| 0 | 0 | 1 | 0 | 0 | 0 | 0 | 1 |
| 0 | 0 | 1 | 0 | 1 | 0 | 1 | 0 |
| 0 | 0 | 1 | 1 | 0 | 0 | 1 | 0 |
| 0 | 0 | 1 | 1 | 1 | 1 | 0 | 1 |
| 0 | 1 | 0 | 0 | 0 | 0 | 0 | 1 |
| 0 | 1 | 0 | 0 | 1 | 1 | 0 | 0 |
| 0 | 1 | 0 | 1 | 0 | 1 | 0 | 0 |
| 0 | 1 | 0 | 1 | 1 | 1 | 0 | 1 |
| 0 | 1 | 1 | 0 | 0 | 0 | 1 | 0 |
| 0 | 1 | 1 | 0 | 1 | 1 | 0 | 1 |
| 0 | 1 | 1 | 1 | 0 | 1 | 0 | 1 |
| 0 | 1 | 1 | 1 | 1 | 1 | 1 | 0 |
| 1 | 0 | 0 | 0 | 0 | 0 | 0 | 1 |
| 1 | 0 | 0 | 0 | 1 | 0 | 1 | 0 |
| 1 | 0 | 0 | 1 | 0 | 0 | 1 | 0 |
| 1 | 0 | 0 | 1 | 1 | 1 | 0 | 1 |
| 1 | 0 | 1 | 0 | 0 | 0 | 1 | 0 |
| 1 | 0 | 1 | 0 | 1 | 0 | 1 | 1 |
| 1 | 0 | 1 | 1 | 0 | 0 | 1 | 1 |
| 1 | 0 | 1 | 1 | 1 | 1 | 1 | 0 |
| 1 | 1 | 0 | 0 | 0 | 0 | 1 | 0 |
| 1 | 1 | 0 | 0 | 1 | 1 | 0 | 1 |
| 1 | 1 | 0 | 1 | 0 | 1 | 0 | 1 |
| 1 | 1 | 0 | 1 | 1 | 1 | 1 | 0 |
| 1 | 1 | 1 | 0 | 0 | 0 | 1 | 1 |
| 1 | 1 | 1 | 0 | 1 | 1 | 1 | 0 |
| 1 | 1 | 1 | 1 | 0 | 1 | 1 | 0 |
| 1 | 1 | 1 | 1 | 1 | 1 | 1 | 1 |

EXCLUSIVE-OR GATE, AN INVERTED TYPE SELECTOR, AND ADDERS

BACKGROUND OF THE INVENTION

This invention relates to a full-adder used in a multiplier circuit.

High speed and low power consumption are required for adders used in a multiplier circuit.

Figure 7:
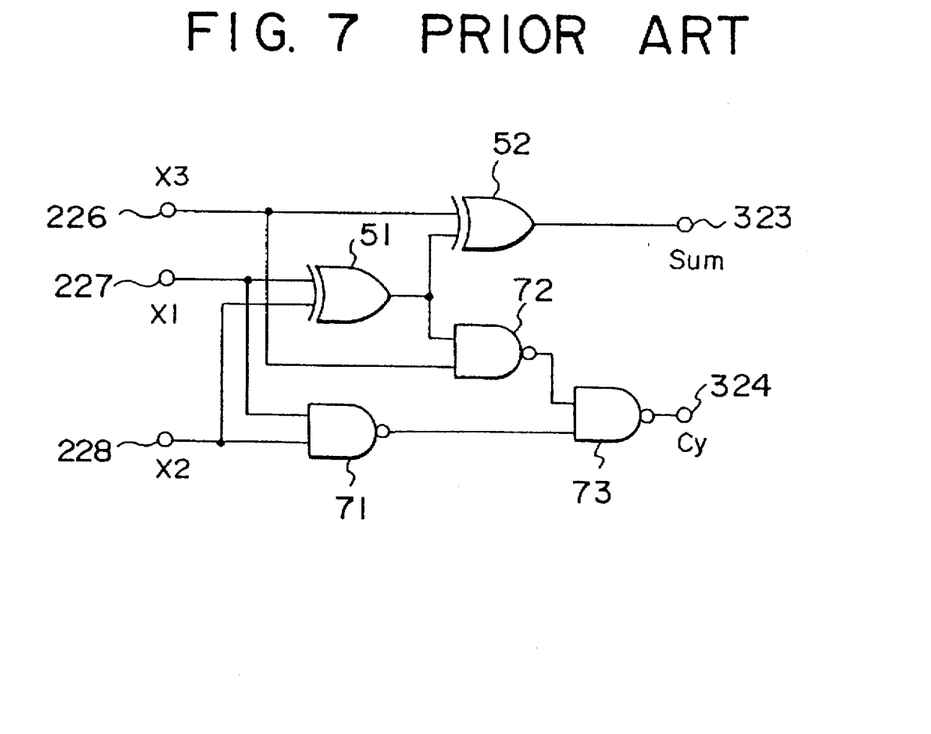
FIG. 7 is a block diagram of a full-adder of a prior art.

A full-adder of a prior art is shown in FIG. 7, where signals X1 and X2 are connected as two input signals to a first exclusive-OR (hereafter abbreviated to XOR) gate 51 and as two input signals to a first NAND gate 71. A signal X3 and output of the first XOR gate 51 are connected as two input signals to a second XOR gate 52 and as two input signals to a second NAND gate 72. Sum output Sum is obtained from output of the second XOR gate 52, and carry output Cy is obtained from output of a third NAND gate 73. Two input signals of the third NAND gate 73 are output signals of the first and the second NAND gates 71, 72.

Figure 5:
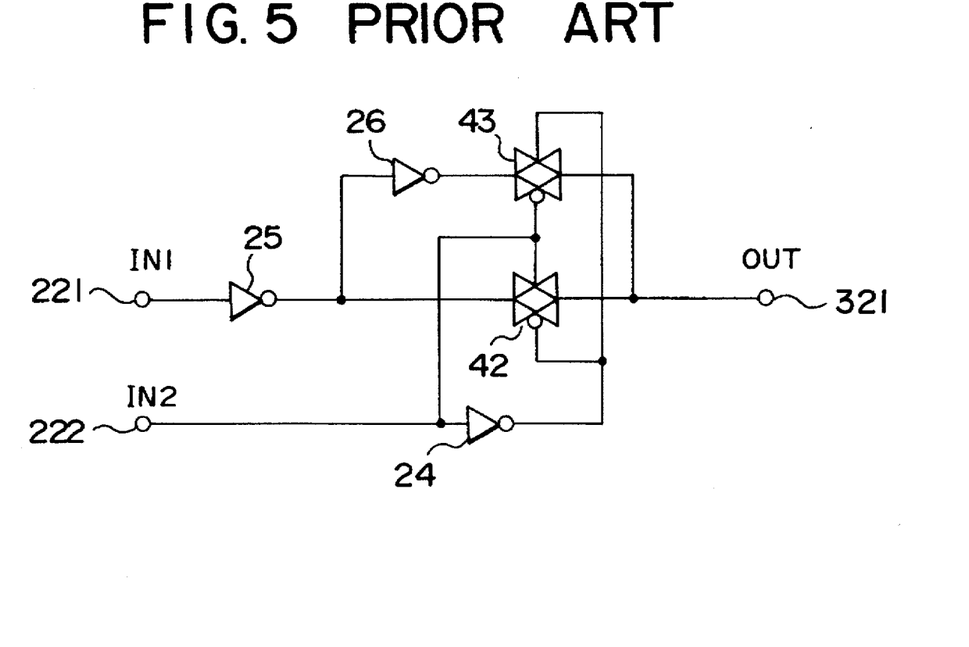
FIG. 5 is a circuit diagram of an XOR gate of a prior art.

An XOR gate 51 or 52 of FIG. 7 is composed as shown in FIG. 5, where a first transfer gate (hereafter abbreviated to TG) 42 is controlled by logic of a second input signal IN2, and a second TG 43 is controlled by inverted logic of the signal IN2. Thus, when the signal IN2 is at logic '1', logic of a first input signal IN1 is inverted by an inverter 25 and passes through the TG 42 to a signal output terminal 321. When the signal IN2 is at logic '0', logic of the signal IN1 (first inverted by the inverter 25 and then returned to the original logic by an inverter 26) passes through the TG 43 to the signal output terminal 321.

A critical path (a path having a largest signal delay) of the full-adder of FIG. 7 is from the input terminal 227 (or 228) to the carry output terminal 324 through the XOR gate 51 and NAND gates 71, 73.

Figure 6:
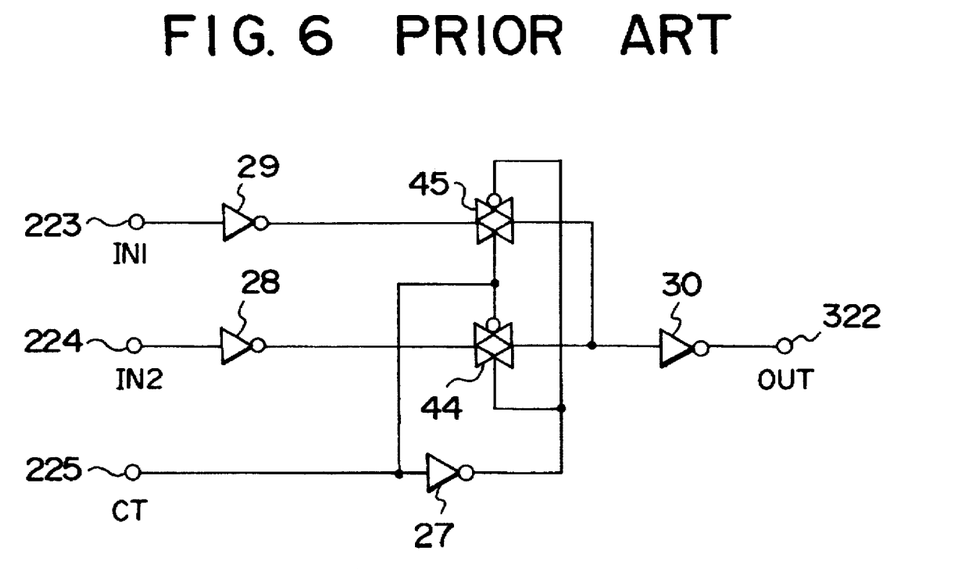
FIG. 6 is a circuit diagram of a selector of a prior art.
Figure 8:
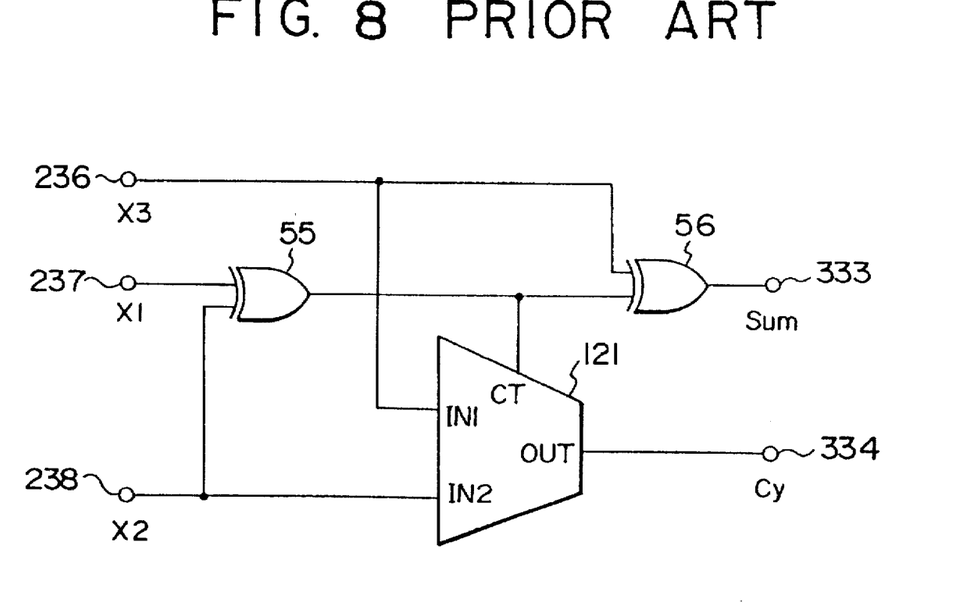
FIG. 8 is a block diagram of another full-adder of a prior art.

Another full-adder of a prior art is shown in FIG. 8, wherein a full-adder is composed of XOR gates 55 and 56, and a selector 121, with input terminals 236, 237 and 238, a sum output terminal 333 and a carry output terminal 334. A circuit shown in FIG. 6 is usually used as the selector 121, wherein a control signal CT controls a TG 45, and the signal CT is inverted by an inverter 27 and controls a TG 44. When the signal CT is at logic '1', logic of a first input signal IN1 passes through the TG 45 to a signal output terminal 322 by way of two inverters 29 and 30, and when the signal CT is at logic '0', logic of a second input signal IN2 passes through the TG 44 to the signal output terminal 322 by way of two inverters 28 and 30.

The critical path of the circuit shown in FIG. 8 is the path from the input terminal 237 (or 238) to the sum output terminal 333 through the XOR gates 55 and 56. It will be understood that the critical path is shorter in the circuit of FIG. 8 than in the circuit of FIG. 7.

Figure 9:
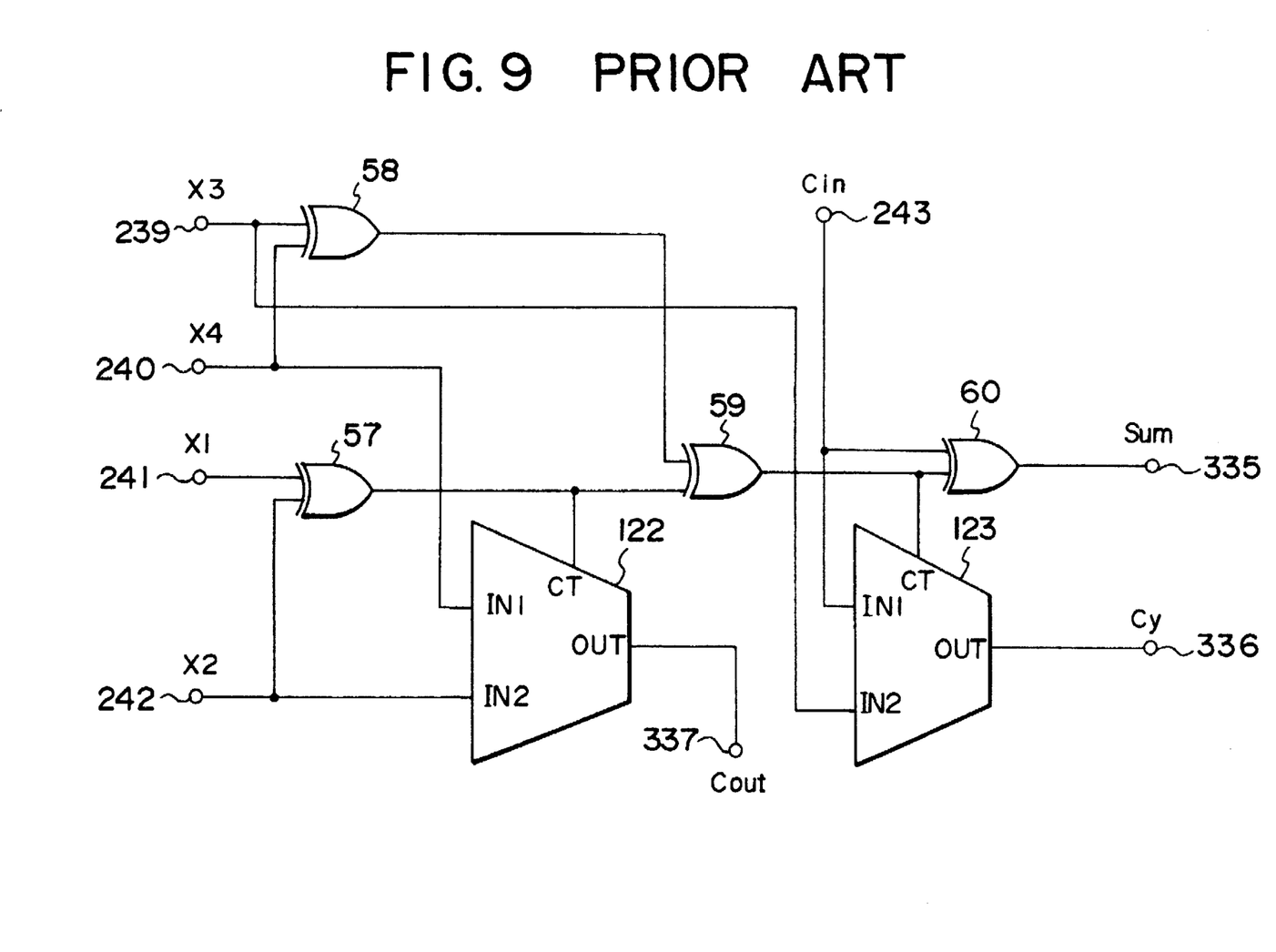
FIG. 9 is a block diagram of a 4-2 compressor of a prior art.

As is well known, a 4-2 compressor is used to construct a tournament adder in a multiplier circuit. FIG. 9 shows a 4-2 compressor of a prior art, wherein a first full-adder is composed of XOR gates 57 and 59, and a selector 122, with input terminals 240, 241 and 242, and a carry output (Cout) terminal 337, and a second full-adder is composed of XOR gates 58 and 60, and a selector 123, with input terminals 239, 243 (Cin), a sum output terminal 335 and a carry output (Cy) terminal 336.

Figure 11:
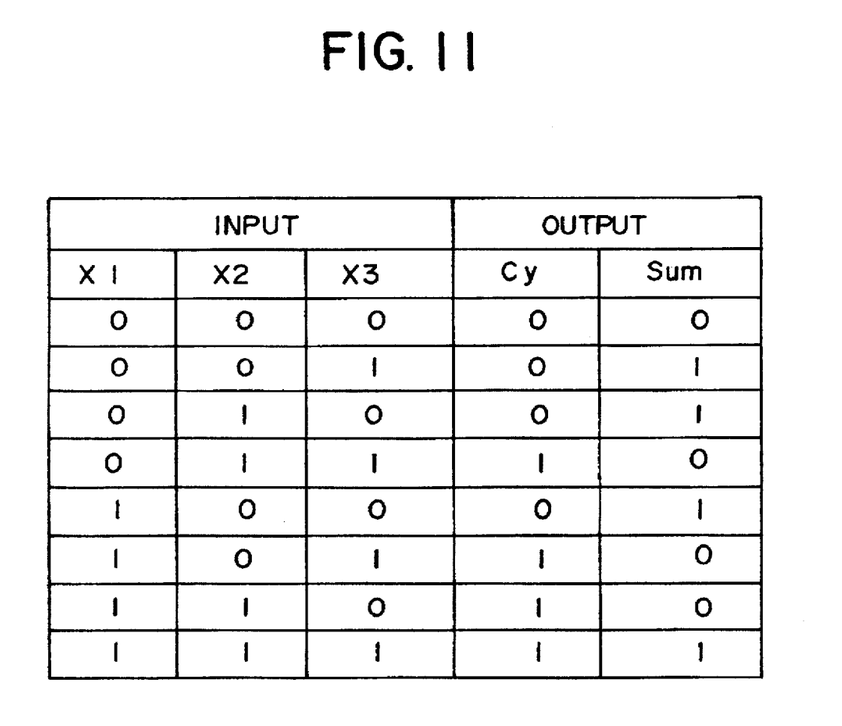
FIG. 11 shows a truth table of a full-adder.
Figure 12:
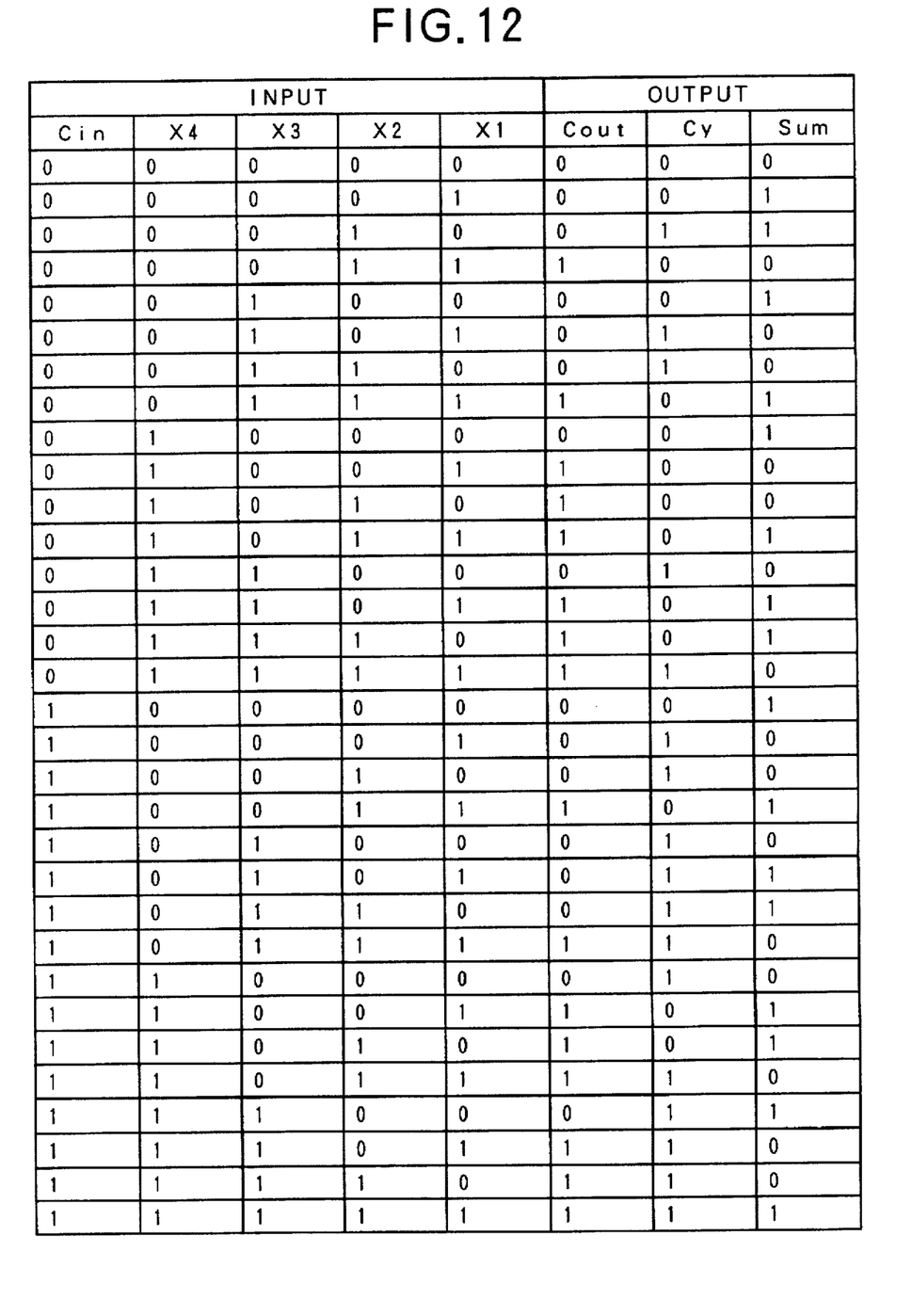
FIG. 12 shows a truth table of a 4-2 compressor.

FIG. 11 shows a truth table of a full-adder and FIG. 12 shows a truth table of a 4-2 compressor.

Figure 10:
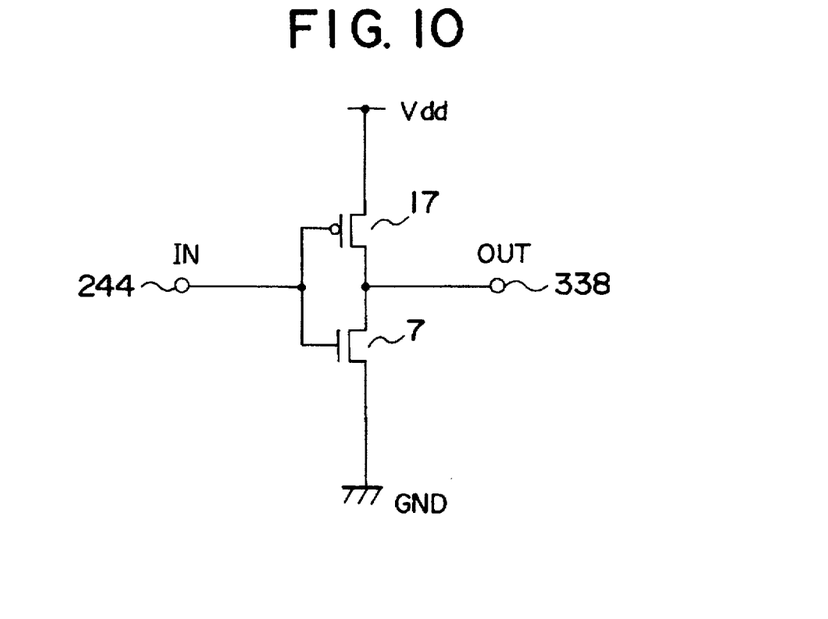
FIG. 10 is a circuit diagram of a conventional inverter.

FIG. 10 shows a circuit diagram of a conventional inverter used in an XOR gate of FIG. 5 or a selector of FIG. 6. A p-type MOSFET (hereafter abbreviated to pMOS) 17 and an n-type MOSFET (hereafter abbreviated to nMOS) 7 is connected in series between a positive terminal Vdd and a grounded terminal GND. When an input signal IN at an input terminal 244 is at logic '1', the nMOS 7 conducts, while the pMOS 17 is cut-off. An output signal OUT at an output terminal 338 is grounded through the nMOS 7 and is at a logic '0'.

When the signal IN at the input terminal 244 changes into logic "0", the nMOS 7 is cut-off, and the pMOS 17 is triggered-on to charge the output terminal 338.

But it is very difficult to guarantee that the nMOS 7 is completely cut-off before start of conduction of the pMOS 17 at a trailing edge of the signal IN. If current in the nMOS 7 is not yet completely cut-off when the pMOS 17 begins to conduct, through current flows from Vdd to GND through the pMOS 17 and the nMOS 7. This through current substantially increases power consumption. Conversely, at a leading edge of the input signal IN, through current flows if current in the pMOS 17 is not yet completely cut-off when the nMOS 7 begins to conduct.

The XOR gate of FIG. 5 has three inverters, and the selector of FIG. 6 has four inverters. A large number of inverters means a large chance of through current.

SUMMARY OF THE INVENTION

Therefore, a primary object of the present invention is to reduce number of inverters in an XOR gate and in a selector. To achieve this object, a new type XOR gate and a new type selector (hereafter called an inverted type selector) are invented.

In both the XOR gate and the inverted type selector of this invention, a serial connection of four MOSFETs is used. In this serial connection of four MOSFETs, through current is effectively reduced as described in a later paragraph.

Another object of this invention is to provide a full-adder circuit with reduced chance of through current using XOR gates of this invention and an inverted type selector of this invention.

Still another object of this invention is to provide a 4-2 compressor circuit with reduced chance of through current using XOR gates of this invention and inverted type selectors of this invention.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1:
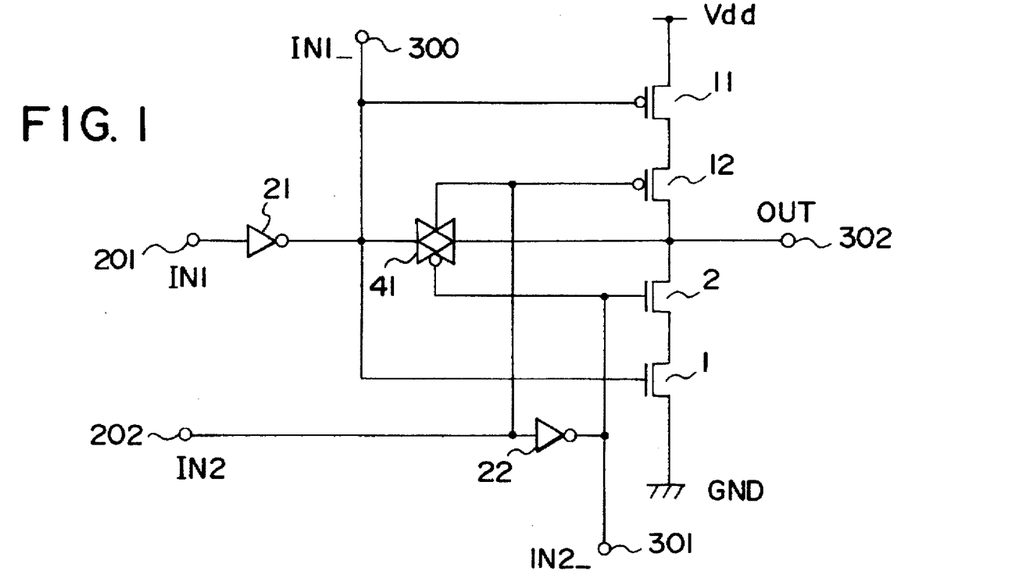
FIG. 1 is a circuit diagram of an XOR gate of an embodiment of the present invention.

Referring to FIG. 1, a new type XOR gate of an embodiment of the present invention is described.

There is a serial connection of four MOSFETs, wherein source terminal of a pMOS 11 of a cascaded connection of two pMOSs 11 and 12, is connected to a positive terminal Vdd of a power supply, drain terminal of the pMOS 12 is connected to an signal output terminal 302, source terminal of an nMOS 1 of a cascaded connection of two nMOSs 1 and 2, is connected to a grounded terminal GND of the power supply, and drain terminal of the nMOS 2 is connected to the signal output terminal 302.

A first input signal IN1 is inverted by a first inverter 21, and the output of the inverter 21 controls gates of the pMOS 11 and the nMOS 1. A second input signal IN2 controls gate of the pMOS 12, and controls gate of the nMOS 2 through a second inverter 22. A transfer gate (TG) 41 is connected between the inverter 21 and the signal output terminal 302, and is controlled by the signal IN2. The output terminals 300 and 301 are used for delivering inverted signals IN1_ and IN2_ of the signals IN1 and IN2 to the inverted type selector of this invention.

When the second input signal IN2 is at logic '1', the pMOS 12 and the nMOS 2 being cut-off, and the TG 41 being on, the signal output terminal 302 is supplied with output of the inverter 21, that is the inverted logic of the first input signal IN1, and there is no through current flowing in the four MOSFETs in series.

When the signal IN2 is at logic '0', the pMOS 12 and the nMOS 2 being on, and the TG 41 being cut-off, the signal output terminal 302 is connected either the terminal Vdd or the terminal GND through the MOSFETs according to the logic of the signal IN1 and outputs the same logic with the signal IN1.

Thus, the chance of through current flowing in the four MOSFETs at the leading and the trailing edge of the signal IN1 is limited when the signal IN2 remains at logic '0'.

When logic of the signal IN2 changes, no through current flows in the MOSFETs as either nMOS 1 or pMOS 11 remains cut-off, because usually leading and trailing edges of the signals IN1 and IN2 don't overlap.

Comparing with the XOR gate of FIG. 5 which has three inverters 24, 25 and 26, in the new type XOR gate of FIG. 1, the chance of through current in the inverter 21 and 22 is as same as that in the corresponding inverter 24 and 26. But the chance of through current in the inverter 26 of FIG. 5, which occurs at every leading and trailing edge of the first input signal IN1, can be reduced about 50% in the XOR gate of FIG. 1.

Figure 2:
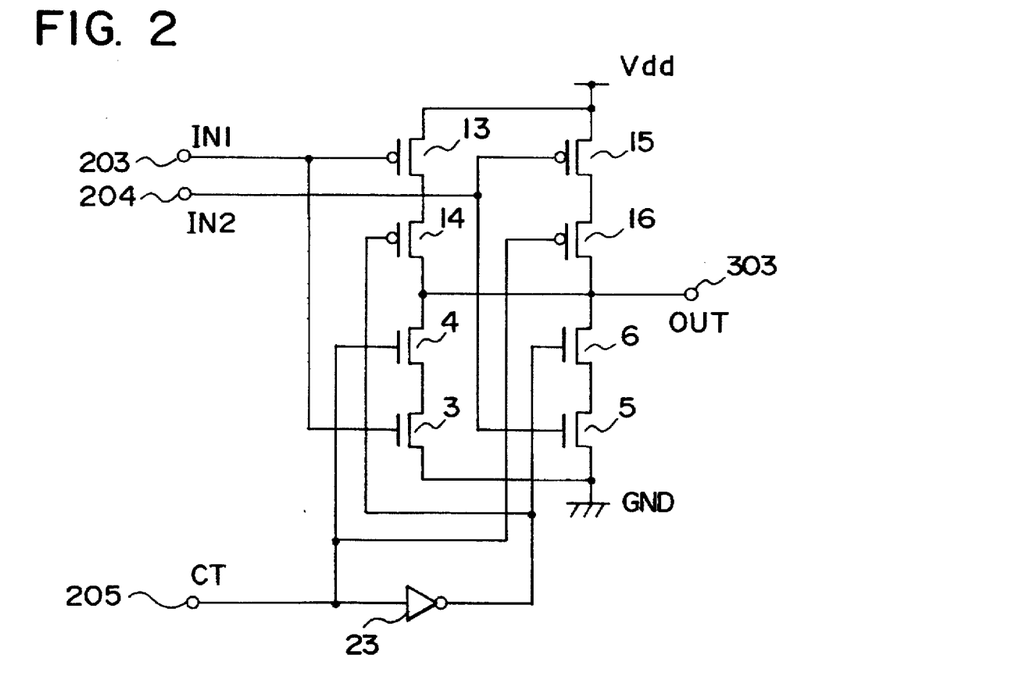
FIG. 2 is a circuit diagram of an inverted type selector of an embodiment of the present invention.

Referring to FIG. 2, an inverted type selector is described. There are two serial connections of four MOSFETs. A control signal CT at a terminal 205 selects either one of the two serial connections of four MOSFETs.

When the control signal CT is at logic '1', output of an inverter 23 is at logic '0', and an nMOS 4 and a pMOS 14 conduct and an nMOS 6 and a pMOS 16 are cut-off. So, a signal output terminal 303 is connected either to a positive terminal Vdd of a power supply or to a grounded terminal GND through the MOSFETs 13, 14 or through the MOSFETs 3, 4 according to the inverted logic of a first input signal IN1 from an input terminal 203, without influence of a second input signal IN2 from another input terminal 204 which is connected to MOSFETs 5 and 15.

When the control signal CT is at logic '0', the nMOS 6 and the pMOS 16 conduct and the nMOS 4 and the pMOS 14 are cut-off. So, the signal output terminal 303 is connected either to the terminal Vdd or to the terminal GND through the pMOS 15 or nMOS 5 which is controlled by the signal IN2 and outputs the inverted logic of the signal IN2.

Thus, there is no through current flowing in the MOSFETs 3, 4, 13 and 14 when the control signal CT is at logic '1', and there is no through current in the MOSFETs 5, 6, 15 and 16 when the control signal CT is at logic '0'. And, in a same way as described with the second input signal IN2 in FIG. 1, no through current flows in the MOSFETs when logic of the control signal CT changes. So, the chance of through current flowing the MOSFETs is limited at the leading and trailing edges of the selected signal.

In the selector of FIG. 6, there is chance of through current at every leading and trailing edge of the first and second input signals IN1 and IN2 in the inverters 28 and 29, that of the selected signal in the inverter 30 and that of the control signal CT in the inverter 27. So, in the inverted type selector of the invention, through current in the inverter 28 and 29 of FIG. 6 can be substantially reduced.

Figure 3:
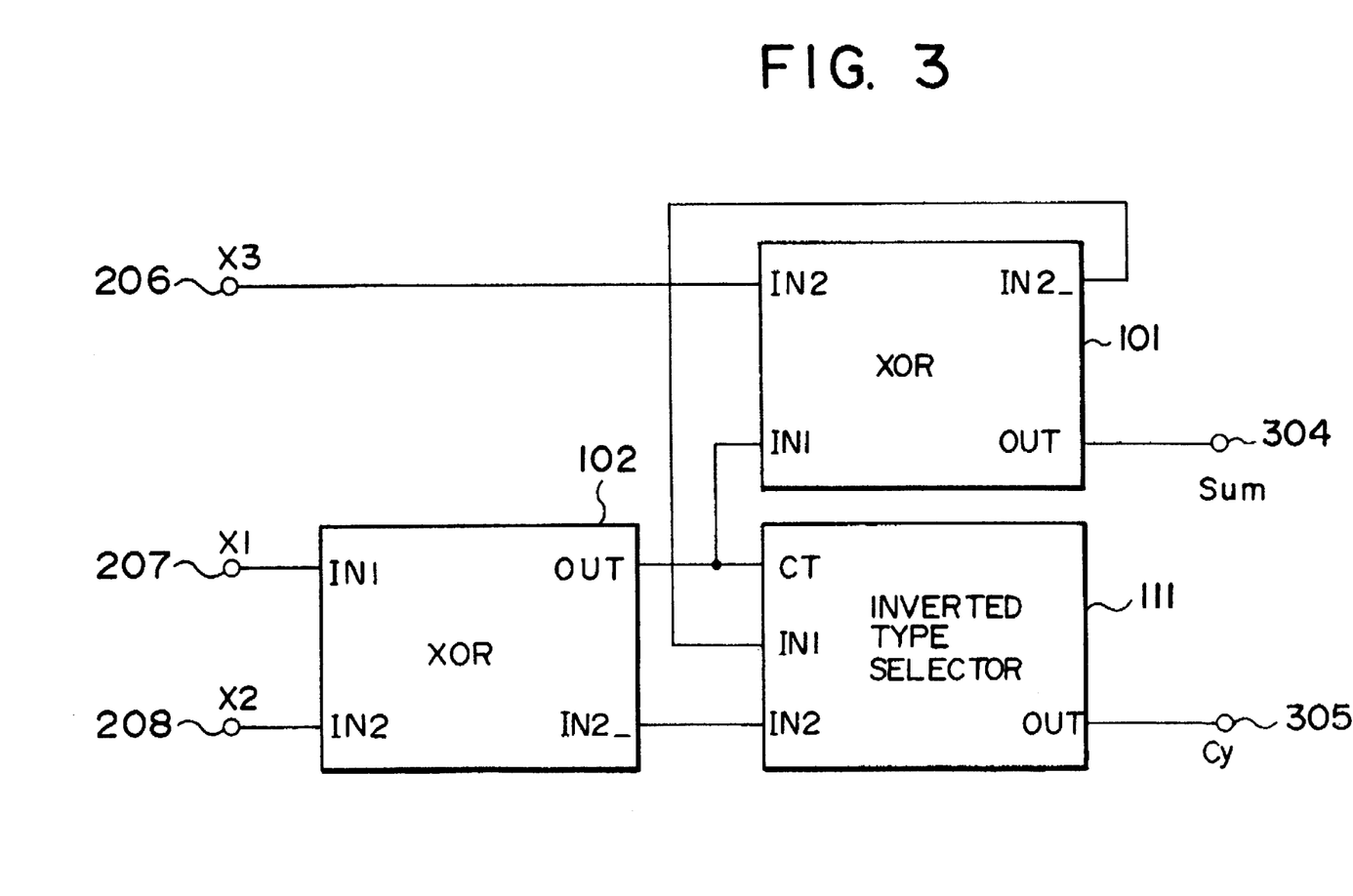
FIG. 3 is a block diagram of a full-adder of an embodiment of the present invention.

FIG. 3 is a block diagram of a full-adder of this invention. Comparing FIG. 3 to FIG. 8, XOR gates 101, 102 of this invention correspond to XOR gates 55, 56 of FIG. 8. The control signal CT to an inverted type selector is the output signal of the XOR gate 102 (corresponding to the XOR gate 55), and the signals X2 and X3 (which are the two inputs to the selector 121) are inverted by the XOR gates 102 and 101 as shown by IN2_ in the XOR gates 102 and 101 to produce the two input signals to the inverted type selector 111. The inverted signal output IN2_ is obtained from a terminal 301 of an XOR gate shown in FIG. 1.

It will be easily understood that the full-adder of FIG. 3 has a same truth table (shown by FIG. 11) with the full-adder of FIG. 7.

As previously described, the inverter 26 in FIG. 5 is eliminated in the present invention of FIG. 1, and the inverters 28, 29 in FIG. 6 are eliminated in the present invention of FIG. 2. Elimination of inverters means elimination of through currents in these inverters and reduction of power consumption. Thus, power consumption of a full-adder of this invention shown by FIG. 3 is substantially reduced than that of a prior art shown by FIG. 7.

Figure 4:
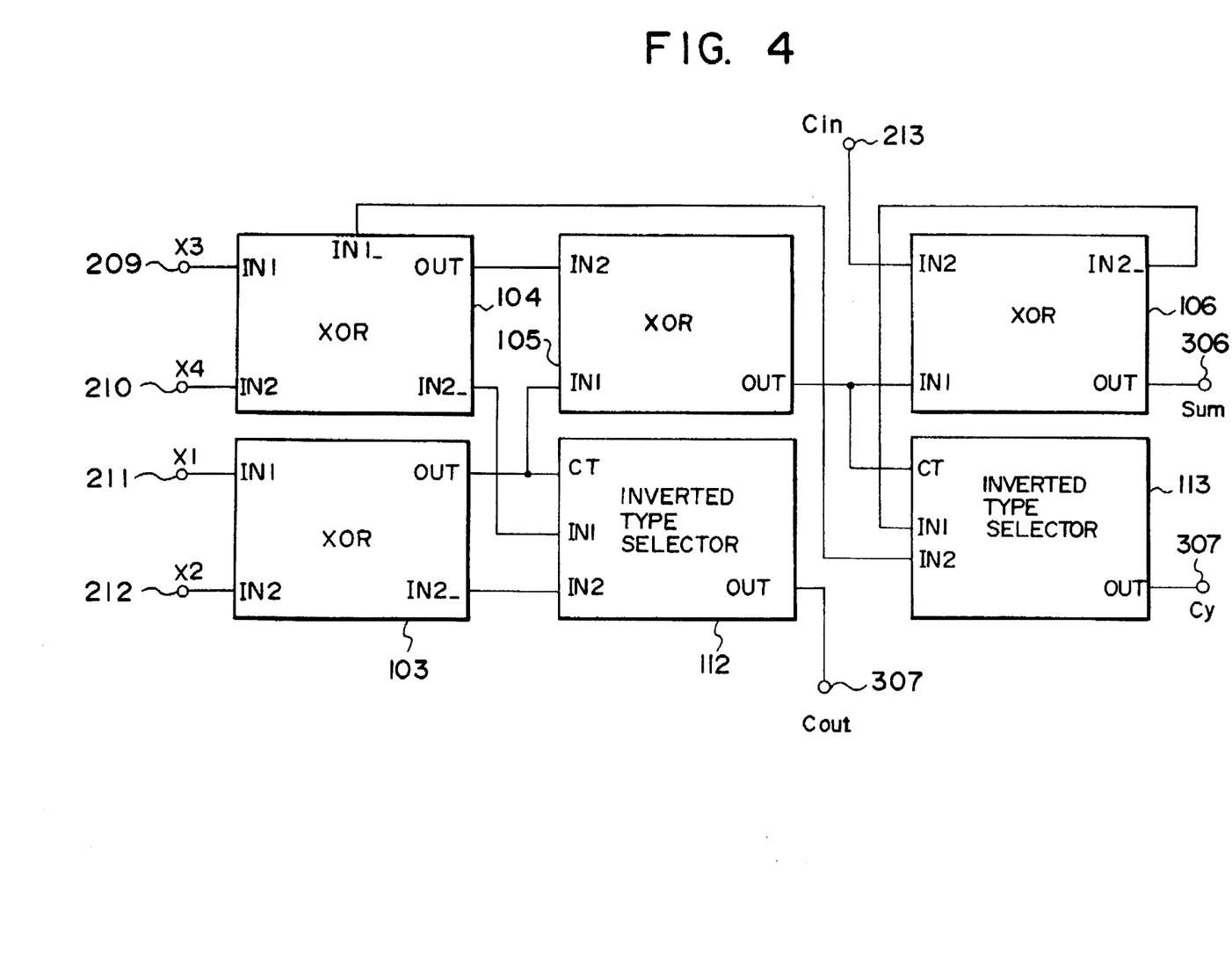
FIG. 4 is a block diagram of a 4-2 compressor of an embodiment of the present invention.

FIG. 4 is a block diagram of a 4-2 compressor of an embodiment of this invention. Comparing FIG. 4 to FIG. 9, XOR gates 103, 104, 105 and 106 correspond to XOR gates 57, 58, 59 and 60 respectively, and inverted type selectors 112 and 113 correspond to selectors 122 and 123. The signal X2 is inverted as a signal IN2_ in the XOR gate 103, and the signal X4 is inverted as a signal IN2_ in the XOR gate 104 to produce two inverted signals to be input to the inverted type selector 112. The signal X3 is inverted as a signal IN1_ in the XOR gate 104, and the signal Cin is inverted as a signal IN2_ in the XOR gate 106 to produce two inverted signals to be input to the inverted type selector 113.

It will be easily understood that the 4-2 compressor of FIG. 4 has a same truth table (shown by FIG. 12) with the 4-2 compressor of FIG. 9.

The carry output Cy at a terminal 307 is an input to a 4-2 compressor connected as the stage following FIG. 4. The carry input Cin comes from a 4-2 compressor connected as an upper circuit to FIG. 4, and the carry output Cout goes to a 4-2 compressor connected as a lower circuit to FIG. 4.

In the 4-2 compressor of FIG. 4, power consumption is reduced than the power consumption in the 4-2 compressor of FIG. 9, because XOR gates of this invention and an inverted type selector of this invention are used in the 4-2 compressor of FIG. 4.

Heretofore, only preferred embodiments of this invention have been described. But it must be understood that there are many modifications without departing from the scope and the spirit of this invention.

For example, when there are two input signals to an XOR gate of FIG. 1, any one of the two signals may be the first input signal IN1. And, in FIG. 1, the pMOS 11 may be controlled by the signal IN2, while the pMOS 12 controlled by the signal IN1_. Similarly, the nMOS 1 may be controlled by the signal IN2_, while the nMOS 2 controlled by the signal IN1_. And in FIG. 2, the pMOS 13 may be controlled by the output of the inverter 23, while the pMOS 14 controlled by the first input signal IN1; the nMOS 3 may be controlled by the control signal CT, while the nMOS 4 controlled by the first input signal IN1; and the pMOS 15 may be controlled by the control signal CT, while the pMOS 16 controlled by the signal IN2; the nMOS 5 may be controlled by the output of the inverter 23, while the nMOS 6 controlled by the signal IN2.

What is claimed is:

1. An exclusive-OR gate, comprising:

a first inverter with its input terminal connected to a first input terminal;

a second inverter with its input terminal connected to a second input terminal;

a transfer gate connected between an output terminal of said first inverter and a signal output terminal, with a positive gate connected to said second input terminal and a negative gate connected to an output terminal of said second inverter;

a cascaded connection of two p-type MOSFETs connected between a positive terminal of a power supply and said signal output terminal, a gate of one of said two p-type MOSFETs being connected to said output terminal of said first inverter, and a gate of the other one of said two p-type MOSFETs being connected to said second input terminal; and a cascaded connection of two n-type MOSFETs connected between said signal output terminal and a grounded terminal of said power supply, a gate of one of said two n-type MOSFETs being connected to said output terminal of said second inverter, and a gate of the other one of said two n-type MOSFETs being connected to said output terminal of said first inverter.

2. An inverted type selector, comprising:

an inverter with its input terminal connected to a control terminal;

a first cascaded connection of two p-type MOSFETs connected between a positive terminal of a power supply and a signal output terminal, a gate of one MOSFET of said first cascaded connection of two p-type MOSFETs being connected to a first input terminal, and a gate of the other one MOSFET of said first cascaded connection of two p-type MOSFETs being connected to an output terminal of said inverter;

a second cascaded connection of two p-type MOSFETs connected between said positive terminal of said power supply and said signal output terminal, a gate of one MOSFET of said second cascaded connection of two p-type MOSFETs being connected to a second input terminal, and a gate of the other one MOSFET of said second cascaded connection of two p-type MOSFETs being connected to said control terminal;

a first cascaded connection of two n-type MOSFETs connected between said signal output terminal and a grounded terminal of said power supply, a gate of one MOSFET of said first cascaded connection of two n-type MOSFETs being connected to said first input terminal, and a gate of the other one MOSFET of said first cascaded connection of two n-type MOSFETs being connected to said control terminal; and a second cascaded connection of two n-type MOSFETs connected between said signal output terminal and said grounded terminal of said power supply, a gate of one MOSFET of said second cascaded connection of two n-type MOSFETs being connected to said second input terminal, and a gate of the other one MOSFET of said second cascaded connection of two n-type MOSFETs being connected to said output terminal of said inverter.

3. A full-adder with input terminals X1, X2 and X3, and output terminals Sum and Cy, having a first and a second exclusive-OR gate and an inverted type selector; wherein:

each of said first and second exclusive-OR gate comprises, a first inverter with its input terminal connected to a first input terminal, a second inverter with its input terminal connected to a second input terminal, a transfer gate connected between an output terminal of said first inverter and a signal output terminal, with a positive gate connected to said second input terminal and a negative gate connected to an output terminal of said second inverter, a cascaded connection of two p-type MOSFETs connected between a positive terminal of a power supply and said signal output terminal, a gate of one of said two p-type MOSFETs being connected to said output terminal of said first inverter, and a gate of the other one of said two p-type MOSFETs being connected to said second input terminal, and a cascaded connection of two n-type MOSFETs connected between said signal output terminal and a grounded terminal of said power supply, a gate of one of said two n-type MOSFETs being connected to said output terminal of said second inverter, and a gate of the other one of said two n-type MOSFETs being connected to said output terminal of said first inverter;

said inverted type selector comprises, an inverter with its input terminal connected to a control terminal, a first cascaded connection of two p-type MOSFETs connected between a positive terminal of a power supply and a signal output terminal, a gate of one MOSFET of said first cascaded connection of two p-type MOSFETs being connected to a first input terminal, and a gate of the other one MOSFET of said first cascaded connection of two p-type MOSFETs being connected to an output terminal of said inverter, a second cascaded connection of two p-type MOSFETs connected between said positive terminal of said power supply and said signal output terminal, a gate of one MOSFET of said second cascaded connection of two p-type MOSFETs being connected to a second input terminal, and a gate of the other one MOSFET of said second cascaded connection of two p-type MOSFETs being connected to said control terminal,

- a first cascaded connection of two n-type MOSFETs connected between said signal output terminal and a grounded terminal of said power supply, a gate of one MOSFET of said first cascaded connection of two n-type MOSFETs being connected to said first input terminal, and a gate of the other one MOSFET of said first cascaded connection of two n-type MOSFETs being connected to said control terminal, and
- a second cascaded connection of two n-type MOSFETs connected between said signal output terminal and said grounded terminal of said power supply, a gate of one MOSFET of said second cascaded connection of two n-type MOSFETs being connected to said second input terminal, and a gate of the other one MOSFET of said second cascaded connection of two n-type MOSFETs being connected to said output terminal of said inverter;

said input terminals X1 and X2 are connected respectively to said first and second input terminals of said first exclusive-OR gate;

said input terminal X3 is connected to said second input terminal of said second exclusive-OR gate;

said signal output terminal of said first exclusive-OR gate is connected to said first input terminal of said second exclusive-OR gate and to said control terminal of said inverted type selector;

said output terminal of said second inverter of said first exclusive-OR gate is connected to said second input terminal of said inverted type selector;

said output terminal of said second inverter of said second exclusive-OR gate is connected to said first input terminal of said inverted type selector;

said signal output terminal of said second exclusive-OR gate is connected with said output terminal Sum; and said signal output terminal of said inverted type selector is connected to said output terminal Cy.

4. A 4-2 compressor with input terminals X1, X2, X3, X4 and Cin, and output terminals Sum, Cy and Cout, having a first, a second, a third and a fourth exclusive-OR gate, and a first and a second inverted type selector; wherein:

each of said first, second, third and fourth exclusive-OR gate comprises,
- a first inverter with its input terminal connected to a first input terminal,
- a second inverter with its input terminal connected to a second input terminal,
- a transfer gate connected between an output terminal of said first inverter and a signal output terminal, with a positive gate connected to said second input terminal and a negative gate connected to an output terminal of said second inverter,
- a cascaded connection of two p-type MOSFETs connected between a positive terminal of a power supply and said signal output terminal, a gate of one of said two p-type MOSFETs being connected to said output terminal of said first inverter, and a gate of the other one of said two p-type MOSFETs being connected to said second input terminal, and
- a cascaded connection of two n-type MOSFETs connected between said signal output terminal and a grounded terminal of said power supply, a gate of one of said two n-type MOSFETs being connected to said output terminal of said second inverter, and a gate of the other one of said two n-type MOSFETs being connected to said output terminal of said first inverter;

each of said first and second inverted type selector comprises,
- an inverter with its input terminal connected to a control terminal,
- a first cascaded connection of two p-type MOSFETs connected between a positive terminal of a power supply and a signal output terminal, a gate of one MOSFET of said first cascaded connection of two p-type MOSFETs being connected to a first input terminal, and a gate of the other one MOSFET of said first cascaded connection of two p-type MOSFETs being connected to an output terminal of said inverter,
- a second cascaded connection of two p-type MOSFETs connected between said positive terminal of said power supply and said signal output terminal, a gate of one MOSFET of said second cascaded connection of two p-type MOSFETs being connected to a second input terminal, and a gate of the other one MOSFET of said second cascaded connection of two p-type MOSFETs being connected to said control terminal,
- a first cascaded connection of two n-type MOSFETs connected between said signal output terminal and a grounded terminal of said power supply, a gate of one MOSFET of said first cascaded connection of two n-type MOSFETs being connected to said first input terminal, and a gate of the other one MOSFET of said first cascaded connection of two n-type MOSFETs being connected to said control terminal, and
- a second cascaded connection of two n-type MOSFETs connected between said signal output terminal and said grounded terminal of said power supply, a gate of one MOSFET of said second cascaded connection of two n-type MOSFETs being connected to said second input terminal, and a gate of the other one MOSFET of said second cascaded connection of two n-type MOSFETs being connected to said output terminal of said inverter;

said input terminals X1 and X2 are connected respectively to said first and second input terminals of said first exclusive-OR gate;

said input terminals X3 and X4 are connected respectively to said first and second input terminals of said second exclusive-OR gate;

said signal output terminal of said first exclusive-OR gate is connected to said first input of said third exclusive-OR gate and to said control terminal of said first inverted type selector;

said output terminal of said second inverter of said first exclusive-OR gate is connected to said second input terminal of said first inverted type selector;

said signal output terminal of said second exclusive-OR gate is connected to said second input terminal of said third exclusive-OR gate;

said output terminal of said first inverter of said second exclusive-OR gate is connected to said second input terminal of said second inverted type selector;

said output terminal of said second inverter of said second exclusive-OR gate is connected to said first input terminal of said first inverted type selector;

said signal output terminal of said first inverted type selector is connected to said output terminal Cout;

said signal output terminal of said third exclusive-OR gate is connected to said first input terminal of said fourth exclusive-OR gate and to said control terminal of said second inverted type selector;

said input terminal Cin is connected to said second input terminal of said fourth exclusive-OR gate;

said output terminal of said second inverter of said fourth exclusive-OR gate is connected to said first input terminal of said second inverted type selector;

said signal output terminal of said fourth exclusive-OR gate is connected to said output terminal Sum; and said signal output terminal of said second inverted type selector is connected to said output terminal Cy.

* * * * *